US007354274B2

(12) United States Patent
Minich

(10) Patent No.: US 7,354,274 B2
(45) Date of Patent: Apr. 8, 2008

(54) CONNECTOR ASSEMBLY FOR INTERCONNECTING PRINTED CIRCUIT BOARDS

(75) Inventor: Steven E. Minich, York, PA (US)

(73) Assignee: FCI Americas Technology, Inc., Reno, NV (US)

( * ) Notice: Subject to any disclaimer, the term of this patent is extended or adjusted under 35 U.S.C. 154(b) by 43 days.

(21) Appl. No.: 11/348,783

(22) Filed: Feb. 7, 2006

(65) Prior Publication Data

US 2007/0184676 A1 Aug. 9, 2007

(51) Int. Cl.
*H01R 12/00* (2006.01)
*H05K 1/00* (2006.01)

(52) U.S. Cl. .......................................... 439/65; 439/61

(58) Field of Classification Search .................. 439/65, 439/60-62, 924.1
See application file for complete search history.

(56) References Cited

U.S. PATENT DOCUMENTS

| | | | | |
|---|---|---|---|---|
| 2,951,184 | A | 8/1960 | Wyma | 317/101 |
| 4,552,420 | A * | 11/1985 | Eigenbrode | 439/67 |
| 4,969,824 | A * | 11/1990 | Casciotti | 439/62 |
| 5,092,781 | A * | 3/1992 | Casciotti et al. | 439/62 |
| 5,190,462 | A | 3/1993 | Lauchner et al. | 439/65 |
| 5,338,207 | A * | 8/1994 | Lineberry et al. | 439/62 |
| 5,676,559 | A * | 10/1997 | Laub et al. | 439/260 |
| 6,402,525 | B2 * | 6/2002 | Gugliotti et al. | 439/65 |
| 6,439,930 | B1 | 8/2002 | Korsunsky et al. | 439/637 |
| 6,866,518 | B1 * | 3/2005 | Korsunsky et al. | 439/61 |
| 6,918,775 | B2 | 7/2005 | Korsunsky et al. | 439/65 |
| 2002/0071259 | A1 | 6/2002 | Roos | 361/784 |

FOREIGN PATENT DOCUMENTS

| | | | |
|---|---|---|---|
| EP | 627792 | A1 * | 12/1994 |
| JP | 10-003969 | | 1/1998 |

* cited by examiner

*Primary Examiner*—Hae Moon Hyeon
(74) *Attorney, Agent, or Firm*—Woodcock Washburn LLP

(57) ABSTRACT

An connector assembly comprises a first connector comprising a first plurality of compliant electrical contacts arranged in first a linear array, a first insertion side, and a first opposed end. The illustrative connector assembly also comprises a second connector comprising a second plurality of compliant electrical contacts arranged in a second linear array, a second insertion side, and a second opposed end. The second plurality of compliant electrical contacts face and are parallel to the first plurality of compliant electrical contacts. The second plurality of compliant electrical contacts are spaced apart from the first linear array of electrical contacts and form a recess there between having an insertion end and termination end.

10 Claims, 17 Drawing Sheets

CONNECTOR ASSEMBLY FOR INTERCONNECTING PRINTED CIRCUIT BOARDS

FIELD OF THE APPLICATION

This application relates to electrical connectors, and more particularly, to connectors for interfacing printed circuit boards.

BACKGROUND

Electronic systems such as switches, routers, and computers typically comprise multiple interconnected printed circuit boards (PCBs). As electronic systems have become more complex, the number of PCBs incorporated in such systems has greatly increased and the interconnections between PCBs have become more intricate. For example, in modern electronic systems, it may be desirable not only to interface multiple daughter cards with a motherboard, but also to interconnect the multiple daughter cards directly with each other.

Applicants have developed improved connectors as well as methods and systems for interconnecting a plurality of PCBs.

SUMMARY

Applicants disclose an illustrative connector assembly. An illustrative connector assembly may comprise a first connector comprising a first plurality of compliant electrical contacts arranged in first a linear array between a first insertion end and a first opposed end. The illustrative connector assembly may also comprise a second connector comprising a second plurality of compliant electrical contacts arranged in a second linear array between a second insertion side and a second opposed end.

The second plurality of compliant electrical contacts face the first plurality of compliant electrical contacts, and the second plurality of compliant electrical contacts are positioned parallel to the first plurality of compliant electrical contacts. The second plurality of compliant electrical contacts are spaced apart from the first linear array of electrical contacts and form an electronic device recess there between having an insertion end opening and termination end. The recess insertion end opening is formed between the first insertion end of the first connector and the second insertion end of the second connector and is adapted to receive an electronic device such as a PCB therein.

The first opposed end and the second opposed end may be fixed relative to each other to form a C-shaped connector assembly. The first opposed end and the second opposed end may have a rigid body there between. For example, the first opposed end and the second opposed end may be attached to a PCB that is at least in-part disposed between the first and second connectors.

In an illustrative embodiment of the connector assembly, the first plurality of compliant electrical contacts comprises a first contact and a second contact. Upon insertion of an electronic device into the electronic device recess, the first contact is compressed by the electronic device before the second contact is compressed by the electronic device. Each of the contacts is adapted to individually deflect away from the recess upon receiving a force applied from the insertion end of the recess. The second contact, which may be, for example, a power contact or detection contact, may be engaged last by an electronic device that is inserted from the insertion end of the recess.

In an embodiment of an illustrative connector assembly, the first plurality of compliant electrical contacts are arranged in rows positioned side by side perpendicular to the insertion end of the first connector. The second plurality of compliant electrical contacts are likewise arranged in rows positioned side by side perpendicular to the insertion end of the second connector.

An illustrative method for interconnecting PCBs comprises providing a first PCB having a leading edge, referred to as an insertion edge, and a plurality of electrical contacts formed thereon. The plurality of electrical contacts are arranged perpendicularly in relation to the insertion edge.

The illustrative method further comprises the step of providing a second PCB having a receiving edge with at least one recess formed therein. The second PCB has an at least one electrical connector attached thereto. The electrical connector comprises a plurality connector contacts for making an electrical connection.

The insertion edge of the first PCB is aligned with the recess formed in the second PCB and the first PCB is inserted into the recess. The PCBs may be inserted at substantially orthogonal angles relative to each other. The plurality of connector contacts attached to the second PCB are successively engaged with the plurality of electrical contacts arranged perpendicularly to the insertion edge on the first PCB. At least one of the plurality of connector contacts is flexibly compressed upon contacting one of the plurality of electrical contacts.

In an embodiment of the illustrative method, the plurality of connector contacts may be arranged in rows positioned side by side perpendicular to the receiving edge of the second PCB, and the electrical contacts may be arranged in rows arranged perpendicular to the insertion edge of the first PCB. In such an embodiment, the at least one row of connector contacts engages with a plurality of rows of electrical contacts arranged perpendicularly to the insertion edge.

At least one of the plurality of electrical contacts may be a detection contact for identifying that the first PCB is completely interfaced with the second PCB. For such an embodiment, the illustrative method may further comprise activating the first PCB upon engaging at least one of the plurality of connector contacts with the detection contact. Similarly, the method may further comprise interrupting electrical communication between the at least one of the plurality of connector contacts and the detection contact, and deactivating the first PCB.

The second PCB may have a first electrical connector comprising a first plurality of connector contacts electrically connected thereto on a first side of the recess. The second printed board may have a second electrical connector comprising a second plurality of connector contacts electrically connected thereto on a second side of the recess. Further, the first PCB may have a first plurality of contacts formed on a first side and a second plurality of contacts formed on a second side. In such an embodiment, successively engaging at least one of the plurality of connector contacts comprises successively engaging at least one of the first plurality of connector contacts with the first plurality of electrical contacts formed on a first side of the first PCB and successively engaging at least one of the second plurality of connector contacts with the second plurality of electrical contacts formed on a second side of the second PCB.

The second PCB may have a second recess formed in its receiving edge, and have connectors with contacts attached proximate the second recess. According to an embodiment of the illustrative method, a third PCB that has an insertion edge and a plurality of electrical contacts arranged perpendicular to thereto may be inserted into the second recess substantially orthogonal to the second PCB. A plurality of contacts on the connectors proximate the second recess are successively engaged by a plurality of contacts arranged perpendicularly to an insertion edge on the third PCB.

The third PCB may have a receiving edge and a recess formed therein. The third PCB may have connectors attached thereto proximate the recess. According to an embodiment of the illustrative method, a fourth PCB may be inserted into the recess formed in the receiving edge of the third PCB. The fourth PCB may be inserted substantially orthogonally to the third PCB. A plurality of contacts on the connectors proximate the recess formed in the third PCB are successively engaged by a plurality of contacts arranged perpendicularly on the fourth PCB.

Applicants also disclose an illustrative system of interconnected PCBs. An illustrative system comprises a first PCB and a second PCB. The first PCB has an insertion edge and has a plurality of electrical contacts formed thereon. The plurality of electrical contacts are arranged perpendicularly in relation to the insertion edge. The second PCB has a receiving edge with a recess formed therein, and has attached thereto at least one electrical connector comprising a plurality of connector contacts. The connector contacts are arranged in rows parallel to the receiving edge, and the rows are positioned side by side perpendicular to the receiving edge. The insertion edge of the first PCB is positioned in the recess formed in the second PCB and the rows of connector contacts operably communicate with the plurality of electrical contacts formed on the first PCB.

Additional features of illustrative embodiments are described below.

BRIEF DESCRIPTION OF THE DRAWINGS

The foregoing summary and the following additional description of the illustrative embodiments may be better understood when read in conjunction with the appended drawings. The potential embodiments of the disclosed systems and methods are not limited to those depicted.

In the drawings.

DETAILED DESCRIPTION OF ILLUSTRATIVE EMBODIMENTS

Figure 1A:
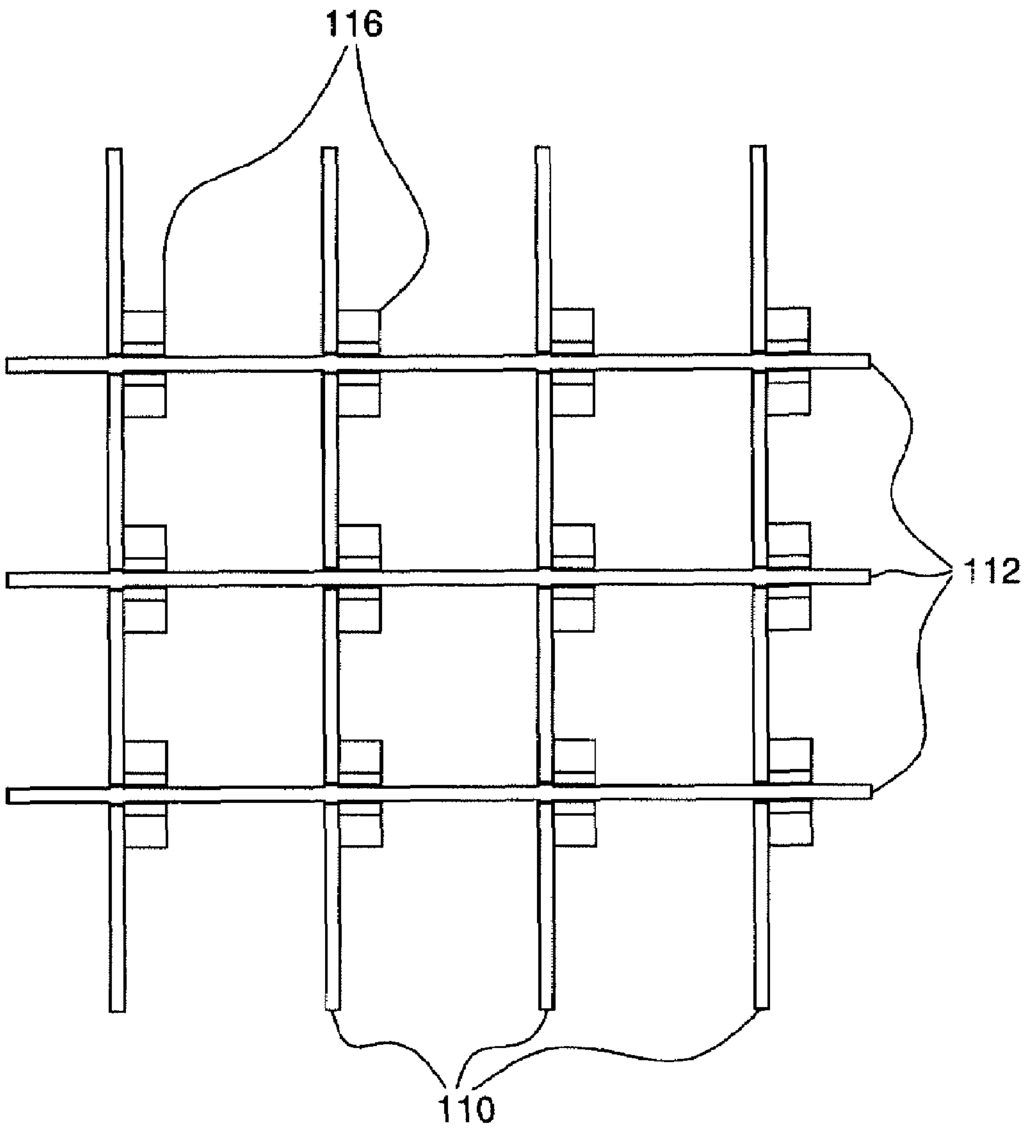
FIG. 1A is front view of an illustrative embodiment of interconnected PCBs.
Figure 1B:
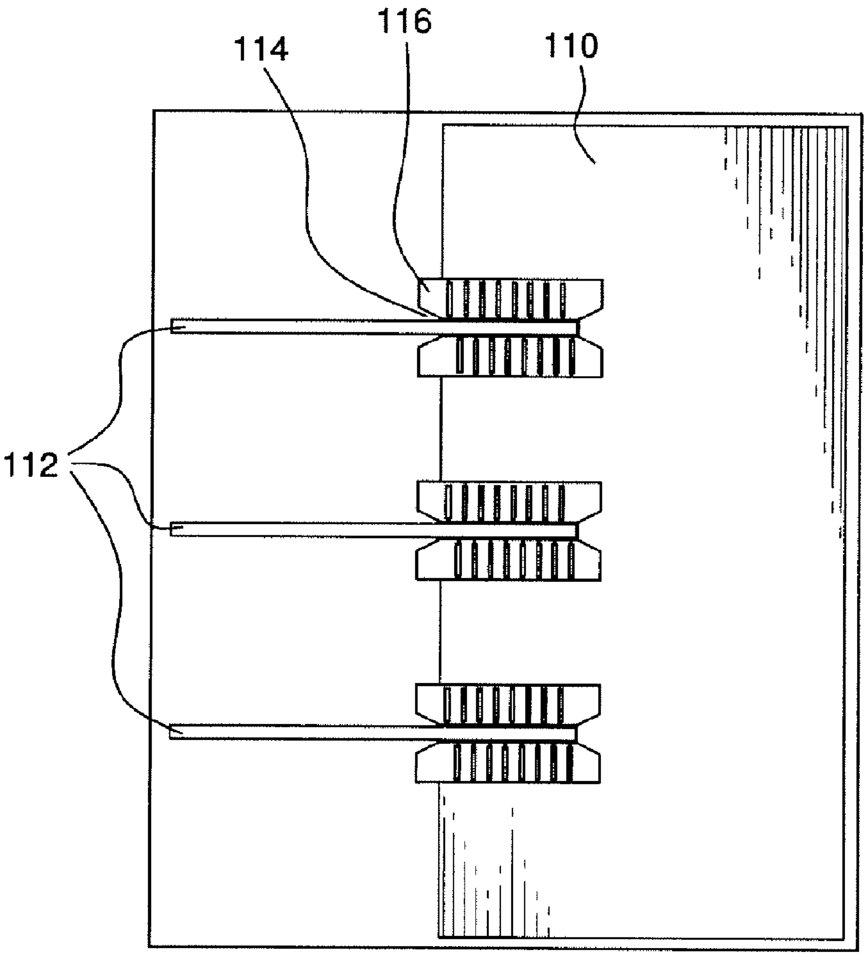
FIG. 1B is a sectional view of an illustrative embodiment.
Figure 1C:
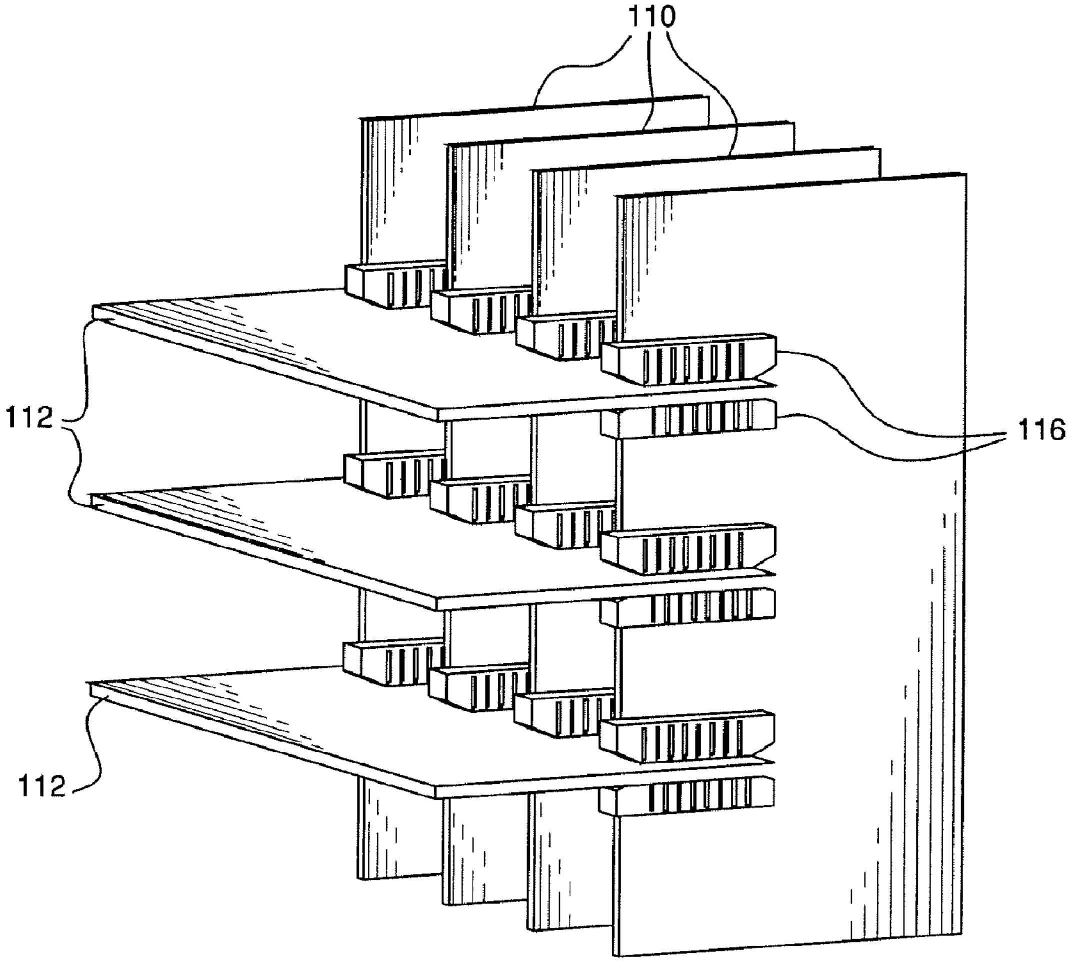
FIG. 1C is a perspective view of an illustrative embodiment.

FIGS. 1A, 1B, and 1C provide front, sectional, and perspective views, respectively, of an illustrative embodiment of a plurality of PCBs 110 and 112 interconnected at substantially orthogonal angles. In the illustrative embodiment, four PCBs 110, which are depicted as being situated vertically, are interfaced with three intersecting PCBs 112, which are depicted as being situated horizontally.

PCBs 110 are intersected at substantially orthogonal angles by PCBs 12. PCBs 110 have recesses 114 formed therein into which PCBs 112 are inserted. Electrical connectors 116 are coupled to PCBs 110 proximate recesses 114 and interface with electrical contacts formed on PCBs 112. In an illustrative embodiment, electrical connectors 116 are formed on opposing sides of recesses 114 and interface with electrical contacts formed on top and bottom sides of PCBs 112. While the number and arrangement of electrical connectors 116 depicted in FIG. 1 is consistent for the depicted interfaces between PCBs, it is understood that the number and arrangement of electrical connectors 116 may vary. For example, in the embodiments of FIG. 1, two electrical connectors 116 are depicted proximate each recess 114. Suitable embodiments may have more or less connectors 116 for each recess 114. Furthermore, while in the embodiments of FIG. 1 connectors 116 are coupled to PCBs 110, it is understood that connectors 116 might be coupled to PCBs 112. Additionally, while in the embodiments of FIG. 1 recesses 114 are formed in PCBs 110, it is understood that recesses 114 could additionally or alternatively be formed in PCBs 112.

Figure 2:
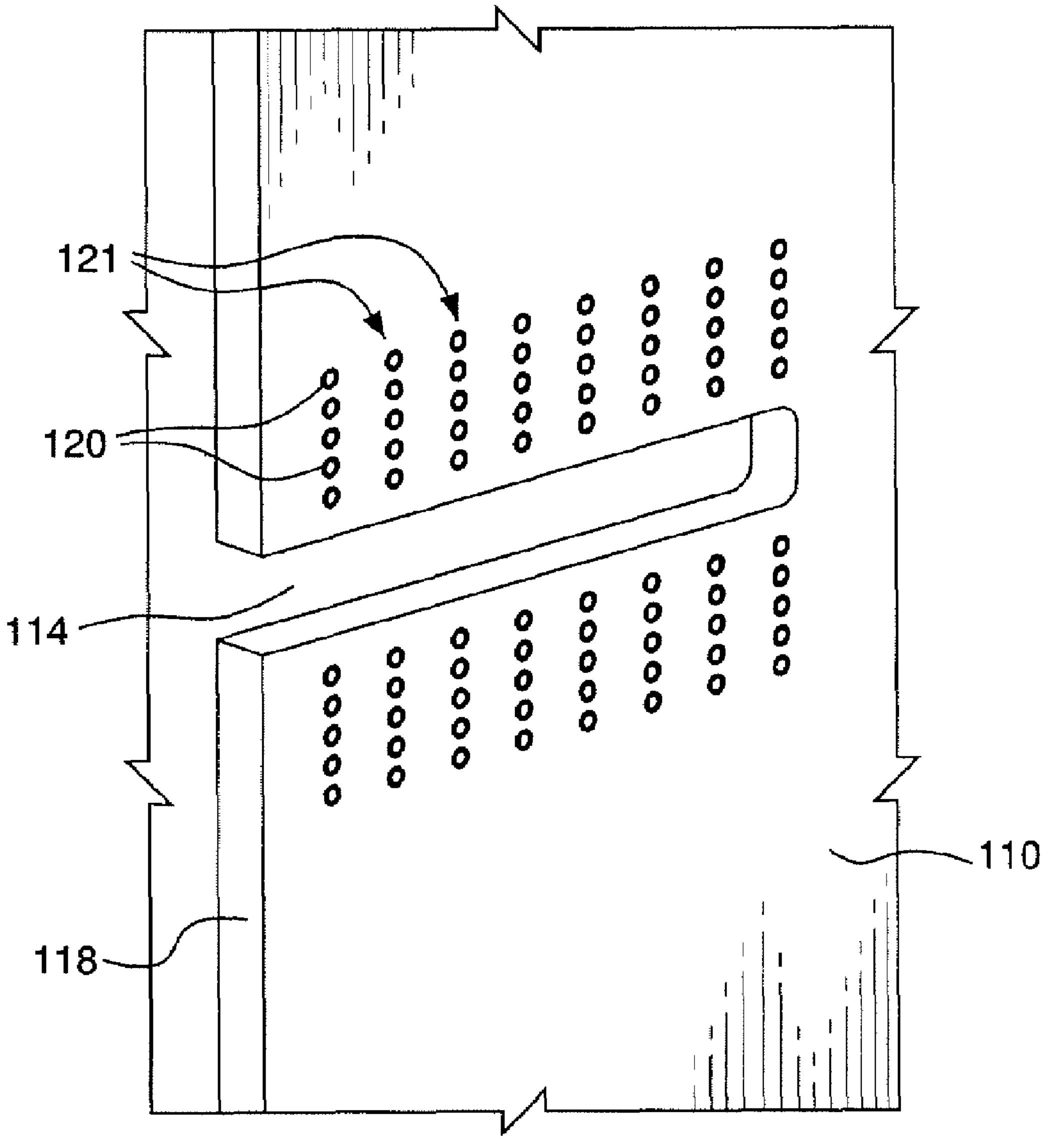
FIG. 2 is an enlarged view of a portion of a receiving edge of a first PCB.

FIG. 2 is an isolated view of a portion of an edge 118 referred to as a receiving edge of one of PCBs 110. As shown, receiving edge 118 has recess or slot 114 formed therein for receiving PCB 112. In an illustrative embodiment, recess 114 is shaped with two substantially parallel sides formed generally perpendicular to receiving edge 118. Recess 114 might have different shapes and configurations suitable for receiving an edge of a PCB. For example, recess 114 might be formed at a different angle to receiving edge 118 than that shown and may have non-parallel sides.

PCB 110 comprises a plurality of electrical contacts 120 formed therein for receiving tail ends of electrical contacts extending from connectors 116. In the exemplary embodiment, electrical contacts 120 are press-fit holes, but any means suitable for electrically connecting connectors 116 to PCB 110 may be used. In an exemplary embodiment, press-fit holes 120 are arranged along the sides of recess 114 and are arranged in rows 121 that are parallel to receiving edge 118. The rows 121 of press-fit holes 120 are aligned side by side extending perpendicularly to receiving edge 118. Thus, the side-by-side rows of press-fit holes 120 form several linear arrays of press fit holes extending perpendicularly away from receiving edge 118. The number and arrangement of press-fit holes 120 may vary and may be any combination that is suitable for the particular application. While not shown, it is understood that press fit holes 120 may be comprised on the opposite side of PCB 112 to that shown. Furthermore, while a single recess 114 is depicted in FIG. 2, PCB 110 may have a plurality of recesses 114 formed therein, and further each recess 114 may have press-fit holes 120 associated therewith.

Figure 3:
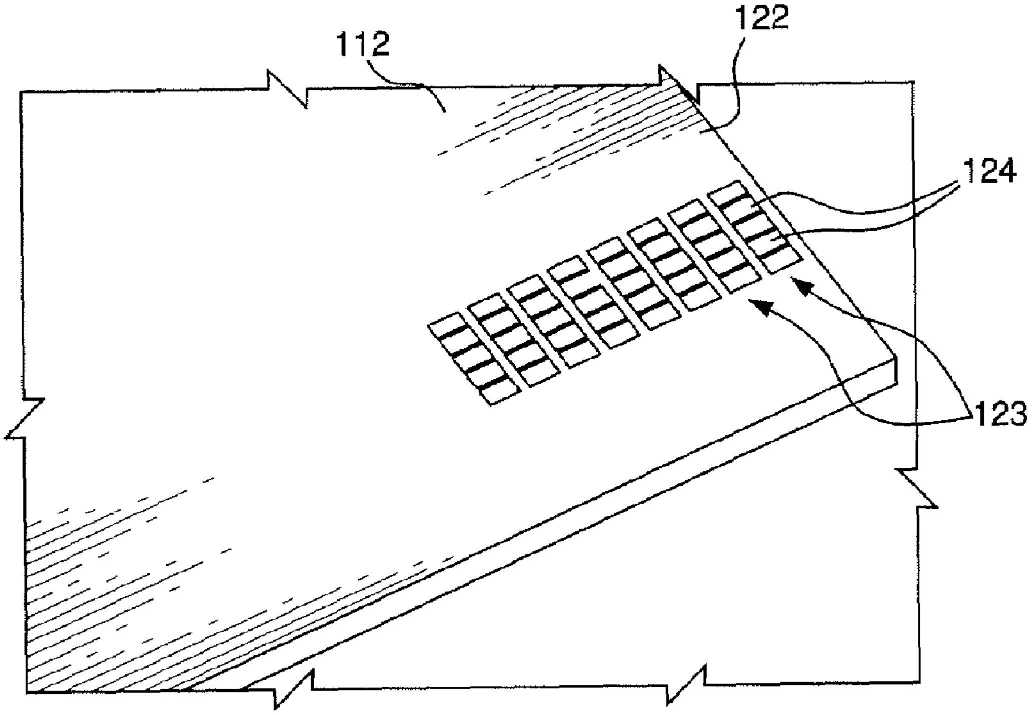
FIG. 3 is an enlarged view of a portion of a leading edge of a second PCB

FIG. 3 provides an isolated enlarged view of a portion of a leading edge 122, which may be referred to as an insertion edge 122, of one of PCBs 112. As shown in FIG. 3, PCB 112 has a plurality of electrical contacts 124 formed thereon. In an embodiment, electrical contacts 124 are surface mounting pads, although any type of contact operable to interface with electrical connector 116 may be employed. Electrical contacts 124 are formed proximate insertion edge 122 and are generally arranged in rows 123 formed parallel to insertion edge 122. The rows 123 of contacts 124 are arranged side by side extending perpendicularly to insertion edge 122. Thus, the side-by-side rows of contacts 124 form several linear arrays of contacts 124 extending perpendicularly away from insertion edge 122. PCB 112 may also have a plurality of electrical contacts 124 formed on the side of PCB 112 opposite to that shown. Furthermore, while only one set or grouping of electrical contacts 124 is depicted, PCB 112 may have a plurality of groupings of electrical contacts 124 per side.

Figure 4:
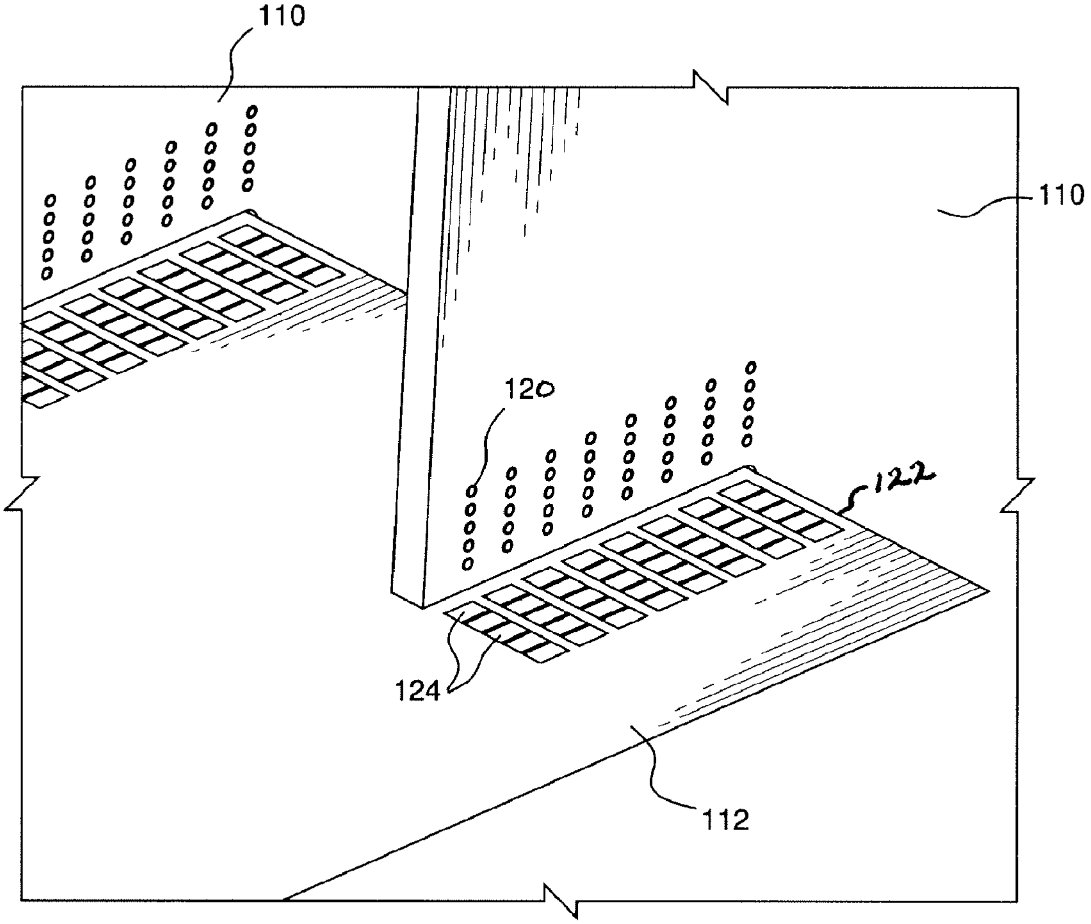
FIG. 4 is a perspective view of a leading edge of a PCB inserted into a recess slot formed in the receiving edge of a PCB.

FIG. 4 provides a perspective view of a PCB 112 orthogonally interfaced with PCBs 110. Connectors 116 are not shown in FIG. 4 so as to facilitate explanation of the system. As depicted in FIG. 4, insertion edge 122 of PCB 112 is inserted into recess 114 formed in PCBs 110. Rows of press holes 120 that are formed on PCBs 110 correspond to rows of contacts 124 that are formed in PCB 112. Electrical connectors 116 (not shown) provide an interface between the rows of press holes 120 and contacts 124. Rows of press holes 120 formed on PCB 110 below the recess 114 (not shown) correspond to rows of contacts 124 that are formed on the bottom side (opposite to side shown) of PCB 112.

Figure 5:
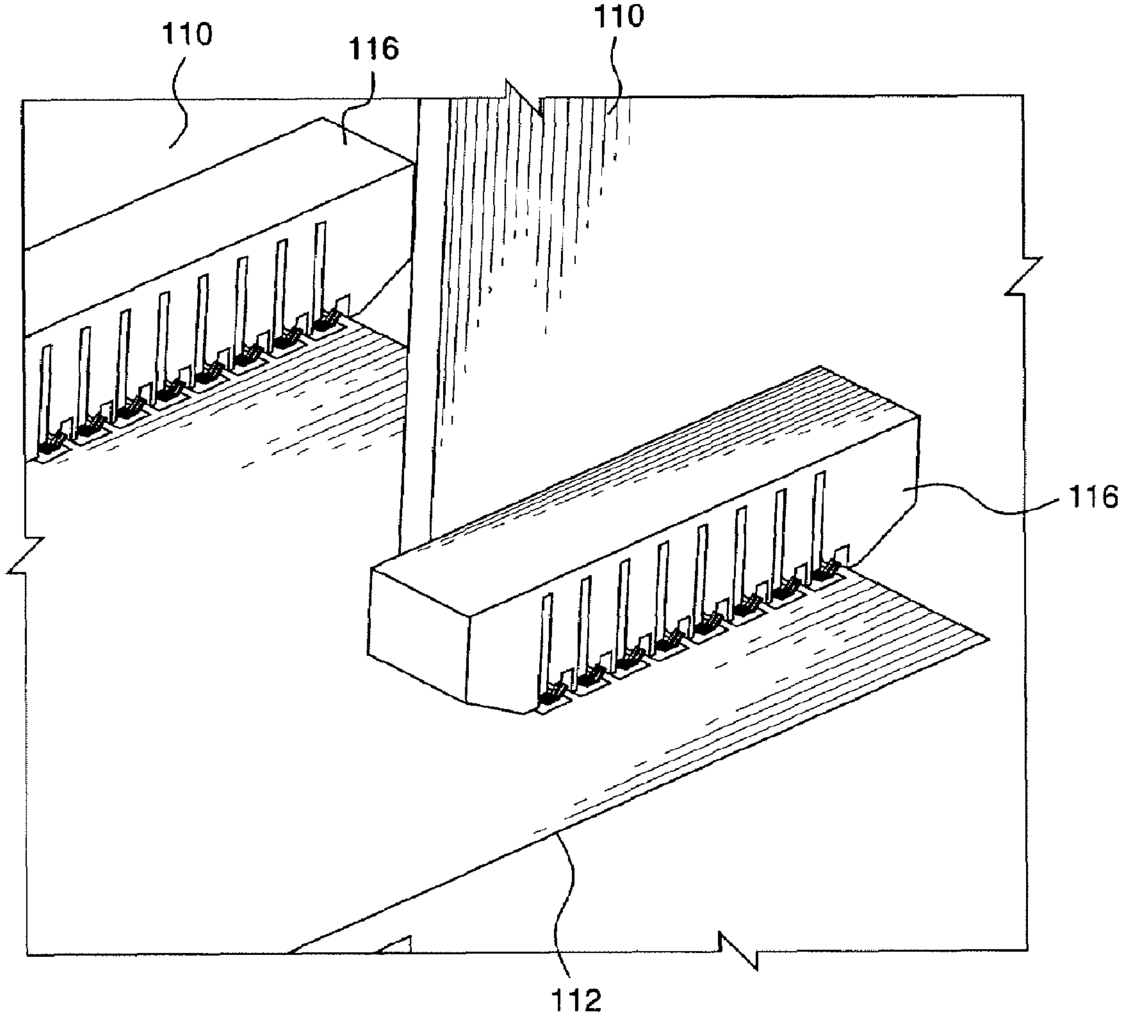
FIG. 5 is a perspective view of a leading edge of a PCB inserted into a recess slot formed in the receiving edge of a PCB having electrical connectors attached thereto.

FIG. 5 provides the same perspective view as FIG. 4, but with electrical connectors 116 shown in place. Electrical connectors 116 are mounted to PCBs 110 and electrically connected to PCBs 110 at press holes 120. Electrical connectors 116 electrically communicate with PCBs 112 via electrical contacts 124.

Electrical contacts 124 have corresponding lead tails that are pressed into press holes 120. In an embodiment, press holes 120 may accommodate lead tales from both sides of a PCB 110. For example, as in FIG. 4, a connector footprint is depicted from the perspective of one side of PCB 110. In an embodiment with an identical footprint on the opposite side of PCB 110, connectors may be mounted on both side of the PCB 110 using the same press holes 120—but from opposite sides of PCB 110.

Figure 6:
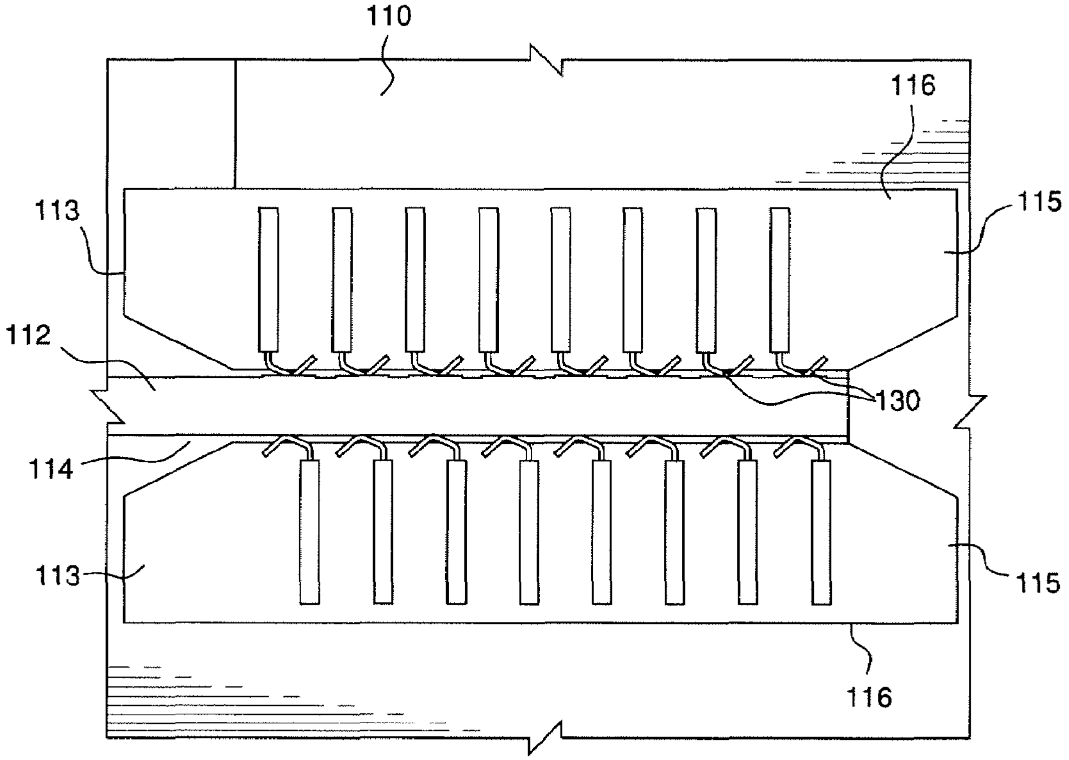
FIG. 6 is a sectional view of a leading edge of a PCB inserted into a recess slot formed in the receiving edge of a PCB having electrical connectors attached thereto.

FIG. 6 provides an isolated sectional view of electrical connectors 116 interfacing with PCB 112. In an illustrative embodiment, electrical connectors 116 are positioned on opposing sides of recess 114. Electrical connectors 116 have insertion ends 113 outwardly facing from the insertion edge of PCB 110, and opposed ends 115 spaced away from insertion ends 113. On each of connectors, electrical contacts 130 are formed in linear arrays between insertion end 113 and oppose end 115. Electrical connectors 116 form an electronic device recess there between with a recess insertion end opening located between insertion ends 113 and proximate the insertion edge of PCB 110, and a termination end in the body of PCB 110. Connectors 116 are attached to PCB 110 with a portion of PCB 110 formed between connector opposed ends 115. Connectors 116 in combination with the portion of PCB 110 between connector opposed ends 115 form a C-like shape for receiving an electronic device.

Figure 7A:
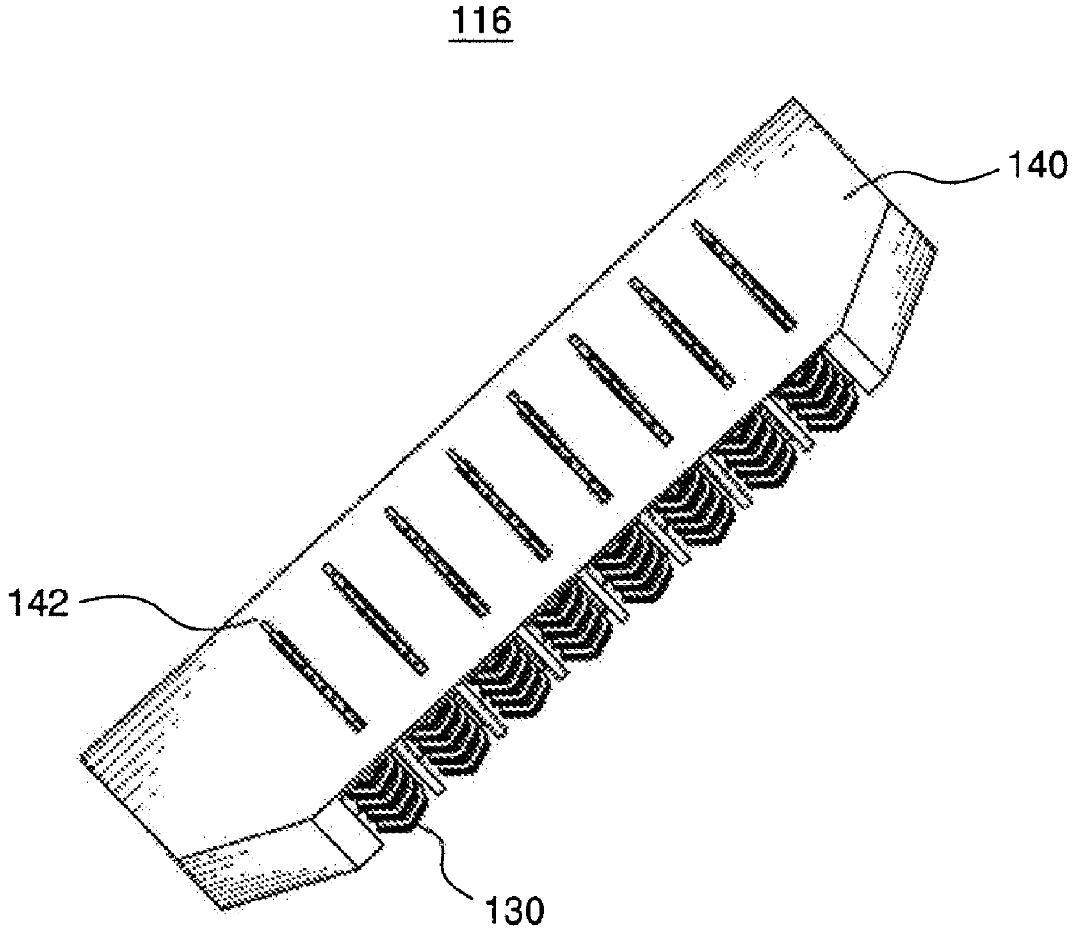
FIG. 7A is a perspective side view of an illustrative connector suitable for connecting PCBs.
Figure 7B:
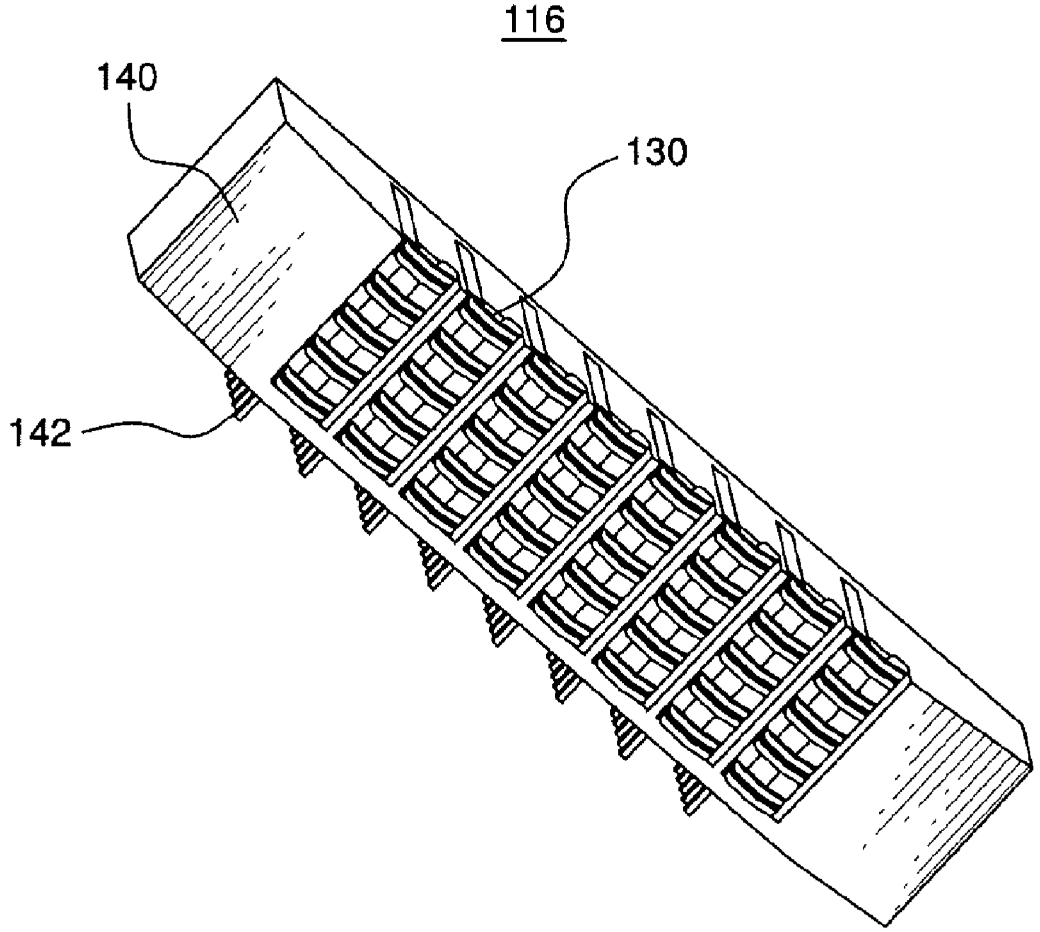
FIG. 7B is a perspective bottom view of an illustrative connector suitable for connecting PCBs.
Figure 7C:
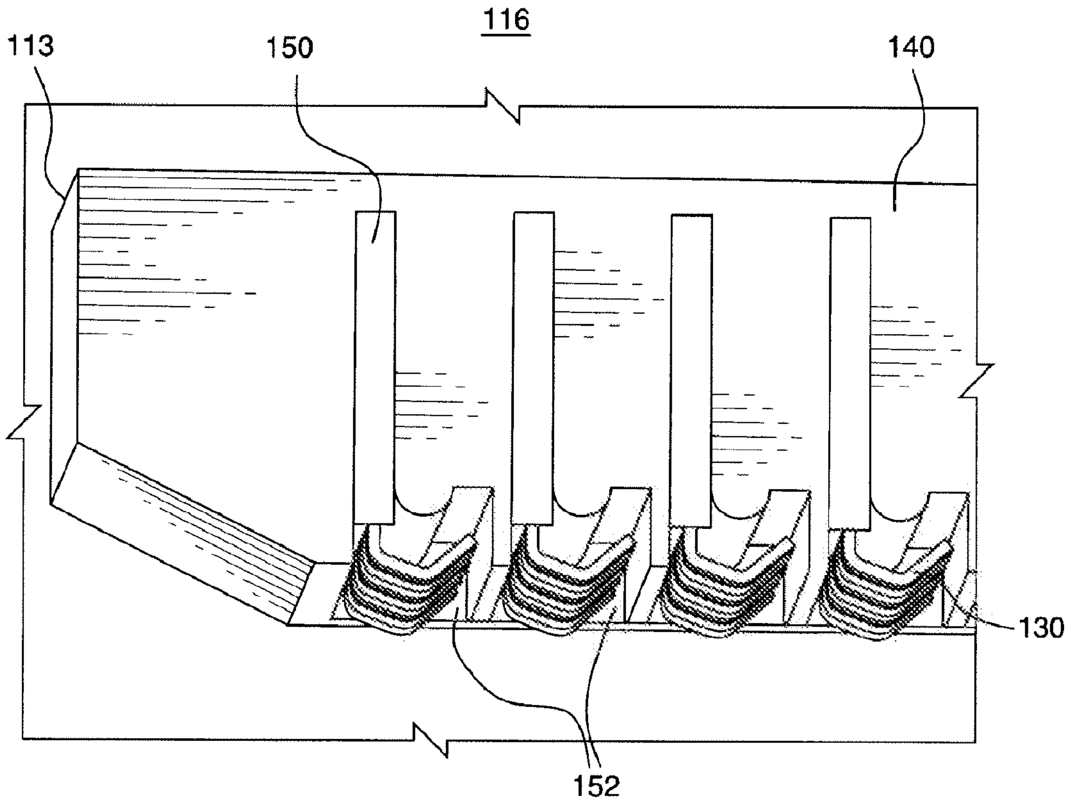
FIG. 7C is an isolated perspective side view of an illustrative connector suitable for connecting PCBs.

When PCB 112 is inserted into recess 114 and between insertion ends 113, connector contacts 130 interface with electrical contacts 124 (not shown) mounted on PCB 112. More particularly, as PCB 112 is inserted into recess 114, rows of connector contacts 130 extending from connector 116 successively interface with the rows 123 of electrical contacts mounted on PCB 112. Thus, in the linear array of connector contacts 130 extending from insertion end 113 to opposed ends 115, a first compliant connector contact 130 positioned proximate insertion end 113 is engaged and compressed before another connector contact 130 positioned in the linear array closer to opposed end 115. In the embodiment of FIG. 6, connectors 116 on opposing sides of recess 114 are identical and interface with an identical arrangement of contacts on opposite sides of PCB 112. In other embodiments, the connectors 116 on opposing sides of recess may not be identical, but rather may accommodate different numbers and arrangements of connector contacts 130. FIGS. 7A, 7B, and 7C provide various perspective views of an embodiment of electrical connector 116. Connector 116 comprise an insulating housing 140 with a plurality of electrical leads having tail 142 and compliant contact 130 sections. In an embodiment, tails 142 are arranged in rows, extend from a side of connector 116, and are suitable for and arranged to be accepted into press holes 120 formed on PCB 110. Compliant connector contacts 130 project from another side of connector 116, are also arranged in rows both parallel and perpendicular to the insertion side of the connector housing, and are suitable for and arranged to be interface with electrical contacts 124 on PCBs 112. As shown in FIG. 7B, electrical contacts 130 may be configured as split beams, although any configuration suitable for making an electrical connector with contacts on a PCB may be employed.

FIG. 7C provides an isolated enlarged view of a portion of electrical connector 116. Connector housing 140 has cavities 152 formed therein for receiving molded lead frame assemblies 150. An area of cavities 152 extends along the edge of connector 116 from which connector contacts 130 extend. Cavities 152 provide room for connector contacts 130 to deflect upward into housing 140. As PCB 112 is inserted into recess 114 of PCB 110, connector contacts 130, which are flexible, are deflected by the surface of PCB 10 and electrical contacts 124 into cavities 152. As PCB 112 is inserted into recess 114 of PCB 110, the connector contacts 130 positioned closest to insertion end 113 successively interface with each row of electrical contacts 124 as PCB 112 is inserted further into recess 114. Because connector 116 sees each electrical contact 124 individually, the force needed for insertion only increases slightly as the PCB 112 is inserted and decreases slightly as the PCB 112 is removed from the PCB 112. Furthermore, because connector 116 sees each row of electrical contacts 124 on PCB 112 individually, PCB 112 may be kept inactive until the last row of electrical contacts, i.e. the row of contacts furthest from insertion edge 122, comes into contact with the leading row of connector contacts 130 positioned closest to receiving edge 118. This signifies that PCB 112 is fully inserted into PCB. Indeed, one of contacts 124 may be identified as a “power,”“detection,” or “hot swap” contact which operates to activate PCB 112 upon mating with a corresponding connector contact. When the last row of electrical contacts, or a designated detection contact, breaks contact with the leading row of connector contacts 130, PCB 112 may be deactivated. This feature facilitates on-the-fly insertion and withdrawal of PCB 112 from interconnection with PCB 110.

Figure 8A:
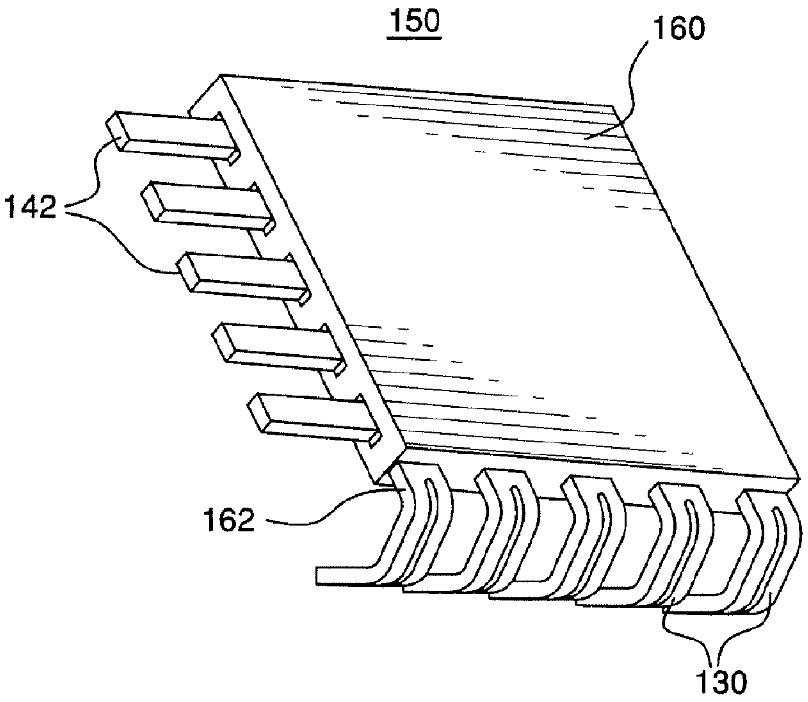
FIG. 8A is a perspective view of an insert molded lead frame assembly for use with an illustrative connector.
Figure 8B:
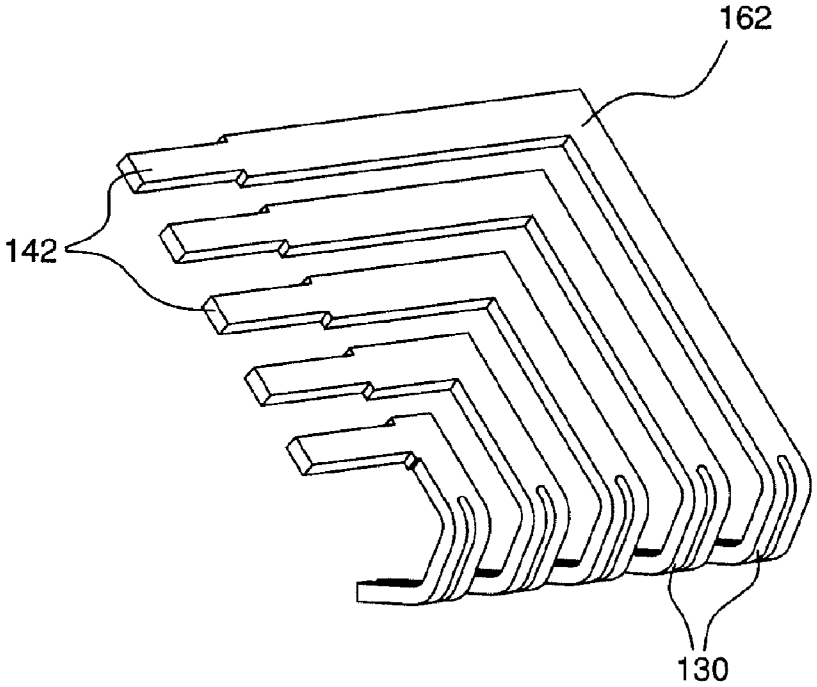
FIG. 8B is a perspective view of a lead frame assembly for use with an illustrative connector.

FIG. 8A provides a perspective view of insert molded lead frame assembly 150. In an illustrative embodiment, assembly 150 comprises a molded plastic body 160 enveloping a portion of lead frame 162. FIG. 8B provides a perspective view of lead frame 162. Referring to FIG. 8A, tail contacts 142 extend from a first side of body 160 and compliant connector contacts 130 extend from another. Upon insertion of assembly into body 160, tail contacts 142 extend from a side of connector 116, and connector contacts 130 extend from another side of connector 116. In the illustrative embodiment of FIGS. 8A and 8B, five connector contacts 130 are substantially aligned. In other embodiments, more or less connector contacts 130 may be used and may also be offset from each other.

Figure 9A:
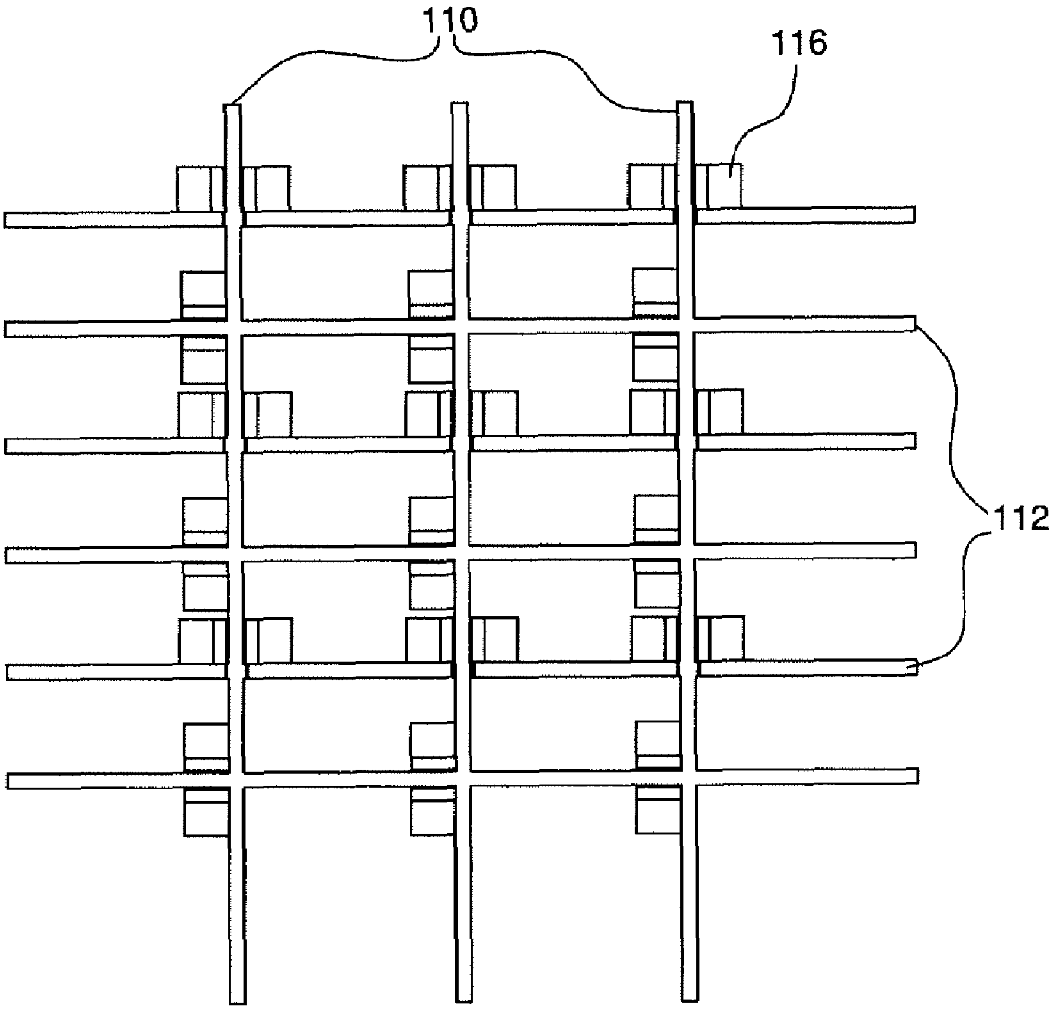
FIGS. 9A through C provide a front view of a plurality of interfaced PCBs.
Figure 9B:
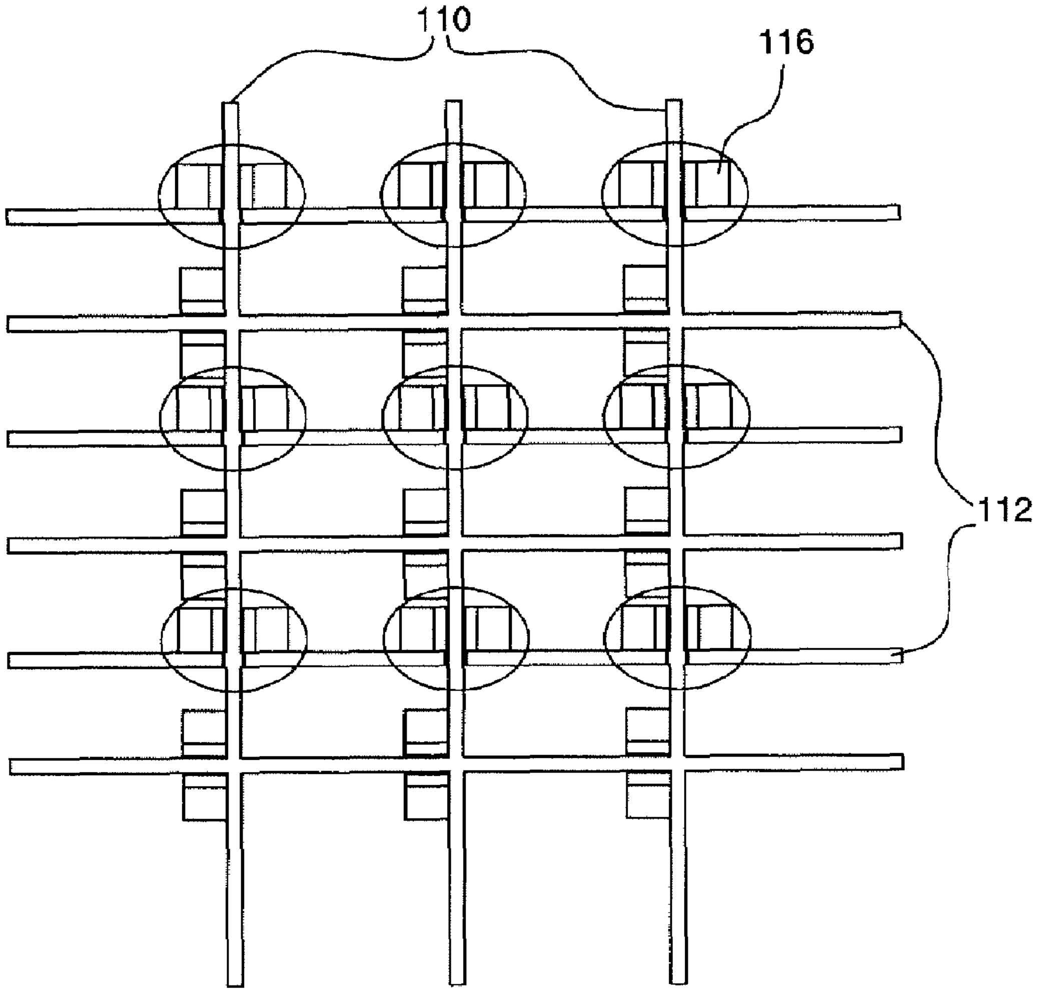
Figure 9C:
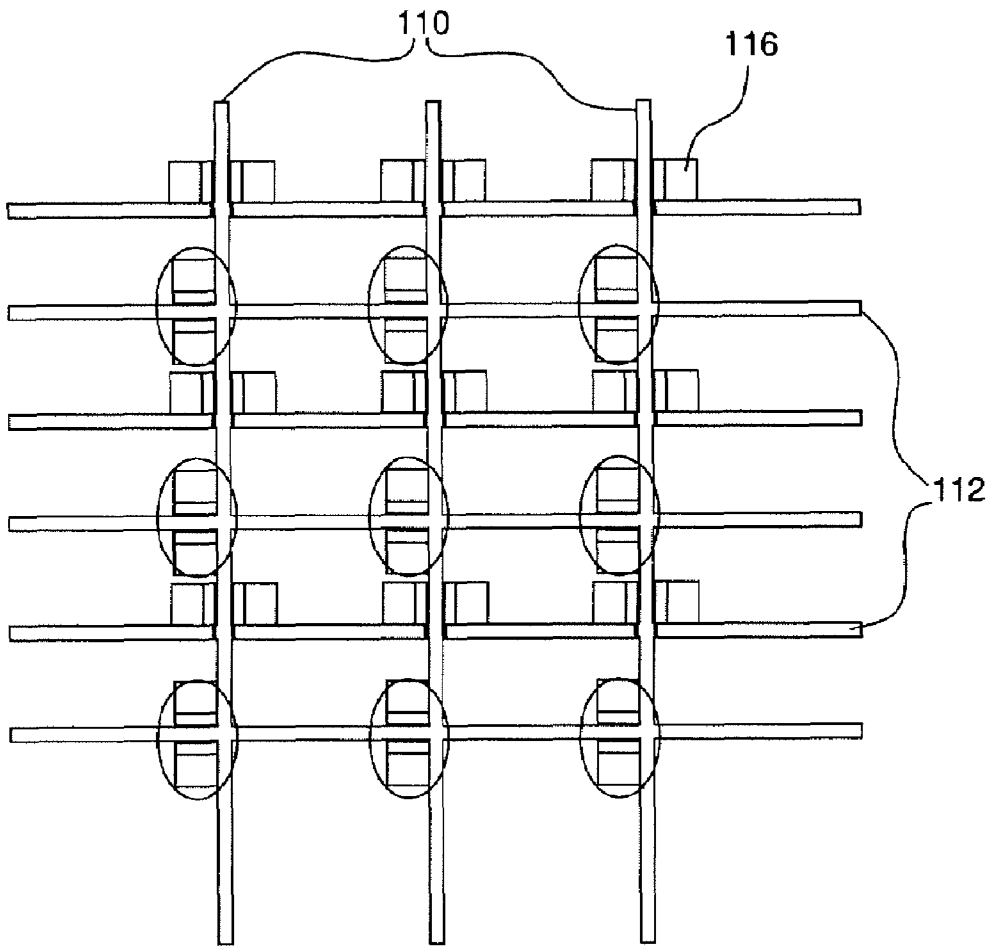

FIGS. 9A through C provide a front view of a plurality of interfaced PCBs. In the embodiment of FIGS. 9A-9C, connectors 116 are coupled to both the vertically arranged PCBs 110 and the horizontally arranged PCBs 112. Coupling connectors 116 to both the vertically arranged PCBs 110 and the horizontally arranged PCBs 112 provides additional guidance during intermating of PCBs 110 and 112.

In FIG. 9B, circles are used to highlight connectors 116 that are attached to horizontal PCBs 112. The connectors 116 are attached to PCBs 112 via press hole contacts 120 as described above, and interface with contacts 124 formed on vertically arranged PCBs 110. Upon interfacing horizontally situated PCBs 112 with vertically situated PCBs 110, vertically situated PCBs 110 are guided between the opposing connectors 116 attached to horizontally situated PCBs 112. Connectors 116 attached to PCBs 112 helps to preserve the relative horizontal positioning of PCBs 110 and PCBs 112 both during interfacing and afterward.

In FIG. 9C, circles are used highlight connectors 116 that are attached to vertically arranged PCBs 110 as described above in connection with FIGS. 1C and 5. Attaching connectors 116 to vertically situated PCBs 110 provides guidance to the correct relative vertical positioning of PCBs 112 during the interfacing of PCBs 110 and 112.

Figure 10:
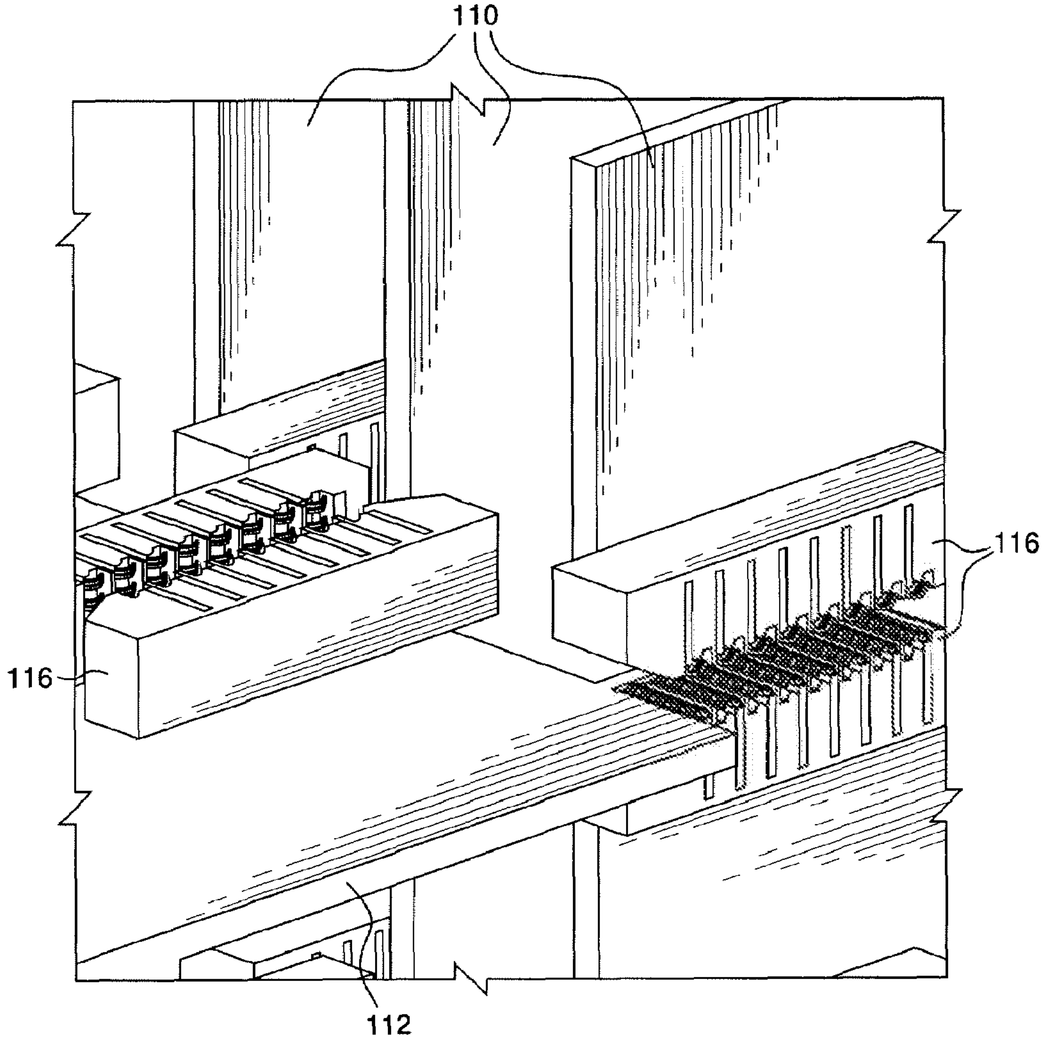
FIG. 10 provides an isolated enlarged perspective view of PCBs aligned for interfacing.

FIG. 10 provides an isolated enlarged perspective view of vertically situated PCBs 110 and horizontally situated PCB 112 arranged for interface (contact pads 124 are not shown for purposes of simplification). As shown, horizontally situated PCB 112 is situated for guidance between connectors 116 that are attached to vertically situated PCB 110. Vertically situated PCB 110 is situated for guidance between connectors 116 attached to horizontally situated PCBs 112. Attaching connectors 116 to both horizontally situated PCBs 112 and vertically situated PCBs 110 facilitates the correct relative positioning of PCBs during and after mating.

Figure 11:
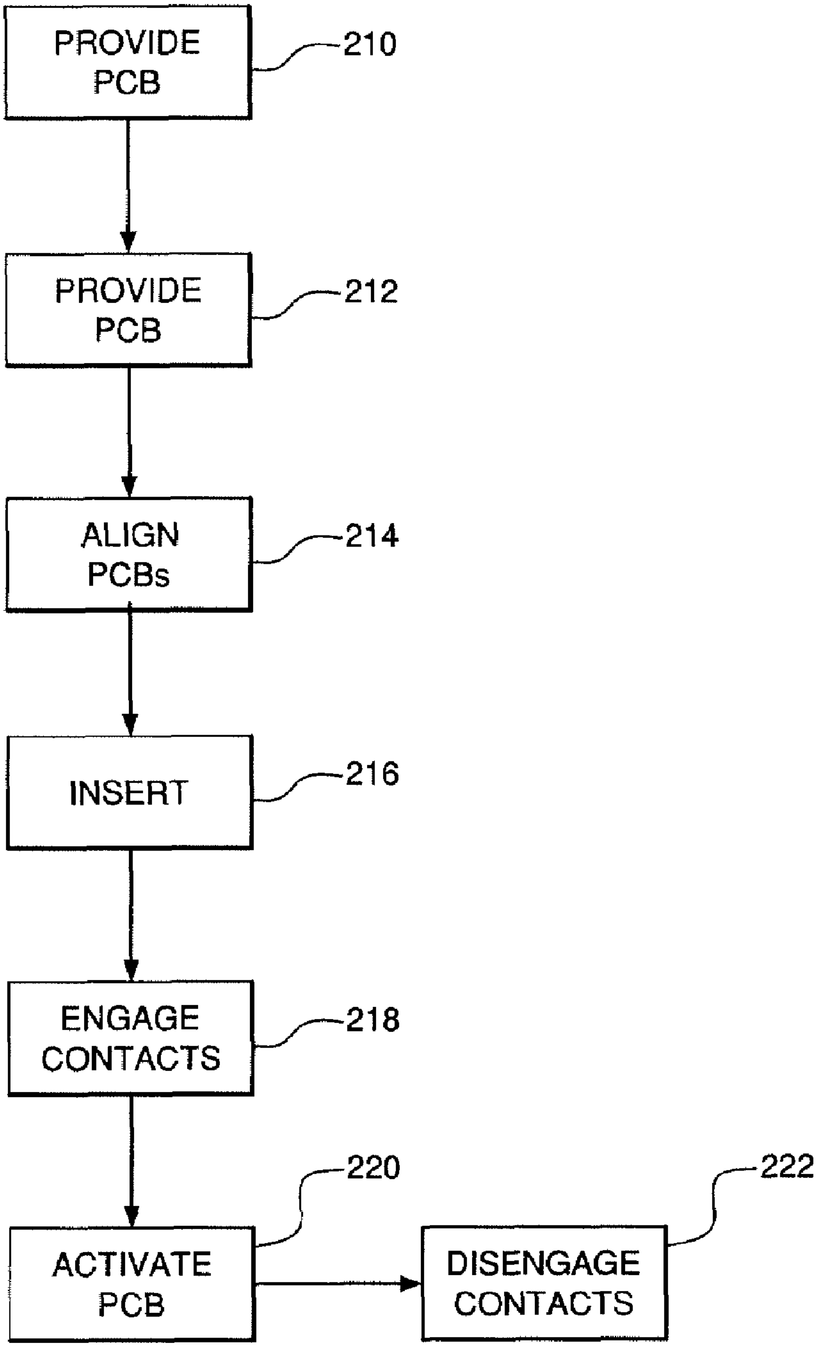
FIG. 11 is a flow chart of a method for interconnecting PCBs.

FIG. 11 provides a flow chart of a method for electrically interconnecting printed circuit boards such as those described above. At step 210, a first PCB is provided. The first PCB may be, for example, PCB 112 having an insertion edge 122 and a plurality of electrical contacts 124 formed thereon. The electrical contacts 124 are arranged in rows that are parallel to the insertion edge 122, but which rows are arranged side by side perpendicularly in relation to insertion edge 122. At step 212, a second PCB is provided. The second PCB may be, for example, PCB 110 having a receiving edge 118 with one or more recesses 114 formed therein. PCB 110 has electrical connector 116 attached thereto having a plurality of connector contacts 130 extending therefrom. Connector contacts 130 are arranged in rows that are parallel to receiving edge 118, but which rows are arranged side by side perpendicularly in relation to receiving edge 118.

At step 214, PCB 112 is aligned with recess 114 formed in PCB 110. PCB 112 is also aligned substantially perpendicular relative to PCB 110. Rough alignment can be accomplished by conventional card guides positioned within a chassis.

At step 216, PCB 112 is inserted into recess 114. PCB is inserted substantially perpendicularly relative to PCB 110.

At step 218, at least one of the plurality of connector contacts 130 is successively engaged 122 with a plurality of electrical contacts 124 arranged perpendicularly in relation to the insertion edge of PCB 112. For example, at least one of the connector contacts 130 interfaces with an electrical contacts 124 closest to insertion edge 122 and successively interfaces with electrical contacts 124 positioned further away from and perpendicular to insertion edge 122. Connector contact 124 is a flexible contact and is deflected into housing 140 upon interfacing with electrical contact 124. In an embodiment, connector contacts 130 and electrical contacts 124 are arranged in rows parallel to receiving edge 122 and insertion edge 122, respectively. For such an embodiment, at step 218, a row of connector contacts 130 is successively engaged with rows of electrical contacts 124 arranged perpendicularly in relation to insertion edge 122 of PCB 112.

At step 220, the at least one connector contact 130 interfaces with an electrical contact 124 that operates to recognize that PCB 112 is fully inserted into PCB 110. For example, one of electrical contacts 124 (or connector contacts 130) may operate as a detection contact which when placed in contact with a corresponding pin signifies that the insertion is complete. When insertion is complete and contact is made with a detection contact, PCB 112 is activated.

PCB 112 may also be disengaged from PCB 110. Accordingly, at step 222, when the at least one connector contact 130 breaks contact with an electrical contact 124 that operate as a detection contact, PCB 112 is deactivated.

Thus, applicants have disclosed systems and methods for interfacing a plurality of PCBs. Connectors fastened to vertically and horizontally PCBs provide guidance in both horizontal and vertical directions when interfacing the PCBs. Electrical contacts formed in rows parallel to the insertion edge of PCBs interface with corresponding connector contacts. Interfacing between the connector contacts and the last row of electrical contacts signifies that the PCB is fully inserted and may be activated. Similarly, upon breaking of electrical connection between the connector contacts and the last row of electrical contacts identifies that the PCB is being removed and should be deactivated.

It is noted that the foregoing examples have been provided merely for the purpose of explanation and are in no way to be construed as limiting of the potential embodiments. While the embodiments have been described with reference to embodiments wherein the number and arrangement of electrical connectors is consistent for all interfaces between PCBs, it is understood that the number and arrangement of electrical connectors may vary between PCBs. Furthermore, the number, shape, and position of recesses formed in PCBs may vary. Still further, the types of contacts and the specific implementation of the electrical contacts may vary. Thus, although the embodiments have been described herein with reference to particular means, materials and embodiments, the potential embodiments are not intended to be limited to the particulars disclosed herein; rather, the potential embodiments extend to all functionally equivalent structures, methods and uses, such as are within the scope of the appended claims.

What is claimed:

1. An electrical connector assembly comprising:

a first connector comprising a housing having a plurality of recesses formed therein and a plurality of lead frame assemblies, each of said plurality of lead frame assemblies positioned in one of the recesses and comprising a compliant electrical contact extending from said housing, the compliant electrical contact extending from each of the plurality of lead frame assemblies forming a first plurality of compliant electrical contacts arranged in first a linear array between a first insertion end and a first opposed end; and a second connector comprising a housing having a plurality of recesses formed therein and a plurality of lead frame assemblies, each of said plurality of lead frame assemblies positioned in one of the recesses and comprising a plurality of compliant electrical contacts extending from said housing, the compliant electrical contact extending from each of the plurality of lead frame assemblies forming a second plurality of compliant electrical contacts arranged in a second linear array between a second insertion end and a second opposed end, wherein the second plurality of compliant electrical contacts face said first plurality of compliant electrical contacts, said second plurality of compliant electrical contacts are parallel to the first plurality of compliant electrical contacts, said second plurality of compliant electrical contacts are spaced apart from said first plurality of compliant of electrical contacts forming an electronic device recess there between, and an insertion end opening defined between said first insertion end and said second insertion end for receiving an electronic device.

2. The electrical connector assembly as recited in claim 1, wherein said first opposed end and said second opposed end are fixed relative to each other and together to form a C-shaped connector assembly.

3. The electrical connector assembly as recited in claim 2, further comprising a rigid body attached between said first opposed end and said second opposed end.

4. The electrical connector assembly as recited in claim 3, wherein said rigid body is a printed circuit board.

5. The electrical connector assembly as claimed in claim 1, wherein the first plurality of compliant electrical contacts comprises a first contact and a second contact, and further wherein upon insertion of the electronic device into said electronic device recess said first contact is compressed by the electronic device before the second contact is compressed by the electronic device.

6. The electrical connector assembly as claimed in claim 1, wherein the first plurality of compliant electrical contacts comprises a first contact and a second contact, and further wherein upon insertion of an electronic device into said electronic device recess said second contact is engaged last by the electronic device.

7. The electrical connector assembly as claimed in claim 6, wherein the second contact is a power contact.

8. The connector of claim 1, wherein at least one of the first plurality of compliant electrical contacts is a detection contact for identifying that a device has been completely inserted into said recess.

9. The connector of claim 1, wherein each of said first plurality of compliant contacts and each of said second plurality of compliant contacts are adapted to individually deflect away from said electronic device recess upon receiving a force applied from said insertion end of said first connector.

10. The connector of claim 1, wherein said first plurality of compliant electrical contacts are arranged in rows positioned side by side perpendicular to the insertion end of said first connector, and said second plurality of compliant electrical contacts are arranged in rows positioned side by side perpendicular to the insertion end of said second connector.

* * * * *